(12) United States Patent
Okayama et al.

(10) Patent No.: US 8,993,064 B2
(45) Date of Patent: *Mar. 31, 2015

(54) SUBSTRATE FOR SUPERCONDUCTING COMPOUND AND METHOD FOR MANUFACTURING THE SUBSTRATE

(75) Inventors: Hironao Okayama, Kudamatsu (JP); Kouji Nanbu, Kudamatsu (JP); Akira Kaneko, Kudamatsu (JP); Hajime Ota, Osaka (JP); Kotaro Ohki, Osaka (JP); Takashi Yamaguchi, Osaka (JP); Kazuhiko Hayashi, Osaka (JP); Kazuya Ohmatsu, Osaka (JP)

(73) Assignees: Toyo Kohan Co., Ltd., Tokyo (JP); Sumitomo Electric Industries, Ltd., Osaka-Shi (JP)

( * ) Notice: Subject to any disclaimer, the term of this patent is extended or adjusted under 35 U.S.C. 154(b) by 246 days.

This patent is subject to a terminal disclaimer.

(21) Appl. No.: 13/510,406

(22) PCT Filed: Nov. 12, 2010

(86) PCT No.: PCT/JP2010/006649
§ 371 (c)(1),
(2), (4) Date: Oct. 31, 2012

(87) PCT Pub. No.: WO2011/061909
PCT Pub. Date: May 26, 2011

(65) Prior Publication Data
US 2013/0040821 A1    Feb. 14, 2013

(30) Foreign Application Priority Data

Nov. 20, 2009 (JP) ................................. 2009-265285

(51) Int. Cl.
| | |
|---|---|
| C22F 1/08 | (2006.01) |
| C23C 10/02 | (2006.01) |
| H01L 39/24 | (2006.01) |
| H01L 39/02 | (2006.01) |
| B32B 15/20 | (2006.01) |
| C22C 9/00 | (2006.01) |
| C22C 19/03 | (2006.01) |

(52) U.S. Cl.
CPC . *C22C 9/00* (2013.01); *C22C 19/03* (2013.01); *C22F 1/08* (2013.01); *H01L 39/2454* (2013.01)
USPC ....... 427/383.7; 427/383.1; 427/62; 427/123; 427/295; 427/307; 505/434; 505/411; 505/470; 505/239; 428/674; 428/677; 428/685; 148/518; 148/536; 216/34

(58) Field of Classification Search
CPC . H01L 39/02; H01L 39/2454; H01L 39/2458; H01L 39/2461; B32B 15/00; B32B 15/01; B32B 15/015; B32B 15/18; B32B 15/20; B32B 18/00; C22F 1/08; C30B 1/02; H01F 12/06; C22C 9/00; C22C 19/03; C23C 10/02
USPC .......... 505/236, 238, 239, 411; 428/674, 675, 428/677, 680; 148/518, 536; 117/9; 427/62, 427/123, 307, 383.1, 383.7, 405, 435, 436, 427/438; 228/116; 216/34
See application file for complete search history.

(56) References Cited

U.S. PATENT DOCUMENTS

| | | | | |
|---|---|---|---|---|
| 2008/0261072 A1* | 10/2008 | Kashima et al. | ............... | 428/677 |
| 2009/0053550 A1* | 2/2009 | Kashima et al. | ............... | 428/601 |

FOREIGN PATENT DOCUMENTS

| | | | | |
|---|---|---|---|---|
| JP | 2003193211 | * | 7/2003 | ............... C22F 1/08 |
| JP | 2005021899 | * | 1/2005 | ............. B23K 20/04 |

(Continued)

OTHER PUBLICATIONS

Helfmeier et al, "Diffusion of Copper in Nickel Single Crystals," J. Apl. Phys., V41, No. 8, 1970, pp. 3202-3205.*
Japanese PCT search report in corresponding application.

*Primary Examiner* — Colleen Dunn
*Assistant Examiner* — Kallambella Vijayakumar
(74) *Attorney, Agent, or Firm* — Browdy and Neimark, P.L.L.C.

(57) ABSTRACT

Provided are a substrate for a superconducting compound and a method for manufacturing the substrate which can realize the excellent adhesive strength simultaneously with high orientation of copper. An absorbed material on a surface of a copper foil to which rolling is applied at a draft of 90% or more is removed by applying sputter etching to the surface of the copper foil, sputter etching is applied to a nonmagnetic metal sheet, the copper foil and the metal sheet are bonded to each other by applying a pressure to the copper foil and the metal sheet using reduction rolls, crystals of the copper in the copper foil are oriented by heating a laminated body formed by such bonding, copper is diffused into the metal sheet by heating with a copper diffusion distance of 10 nm or more, and a protective layer is laminated to a surface of the copper foil of the laminated body.

7 Claims, 6 Drawing Sheets

(56) References Cited

FOREIGN PATENT DOCUMENTS

| | | | | |
|---|---|---|---|---|
| JP | 2006127847 | A | | 5/2006 |
| JP | 2007115562 | * | | 5/2007 ............ H01B 12/06 |
| JP | 2007115562 | A | | 5/2007 |
| JP | 2008-269852 | A1 | | 11/2008 |
| JP | 2008266686 | A | | 11/2008 |

\* cited by examiner

SUBSTRATE FOR SUPERCONDUCTING COMPOUND AND METHOD FOR MANUFACTURING THE SUBSTRATE

TECHNICAL FIELD

The present invention relates to a substrate for a superconducting compound which is used as a substrate on which a superconducting compound is deposited, and a method for manufacturing the substrate.

BACKGROUND ART

With respect to an excellent substrate for a high-temperature oxide superconducting compound, an intermediate layer having high crystal orientation ($CeO_2$ or zirconia doped yttrium oxide (YSZ)) is formed on a metal substrate, and a superconducting compound layer (RE123 film: RE: Y, Gd, Ho or the like) is further formed on the intermediate layer.

As a method for forming these oxide films, conventionally, there have been known an ion-assisted-beam film forming method (IBAD method) and a RABITS method where an oxide film is formed on a metal substrate whose crystals are oriented in advance.

To take future production efficiency such as a film forming speed into consideration, a substrate for an oxide superconducting compound manufactured by the RABITS method is advantageous. However, to enhance the superconducting property using such a manufacturing method, it is important to make crystals of the metal substrate highly oriented.

As such a metal substrate, there has been disclosed a substrate where copper is laminated to a stainless steel substrate, crystals of copper are highly oriented, and an intermediate layer made of nickel is laminated to the copper layer (see patent document 1, for example).

Further, as a method for manufacturing such a metal substrate, there has been disclosed a technique where a copper layer which is subjected to high rolling reduction is subjected to heat treatment such that copper crystals in the copper layer are highly oriented, the highly-oriented copper layer is laminated to a stainless steel substrate by cold rolling, and a nickel layer is laminated to the copper layer (see patent document 2, for example).

PRIOR ART DOCUMENT

Patent Document

Patent document 1: JP-A-2006-127847
Patent document 2: JP-A-2008-266686

SUMMARY OF THE INVENTION

Problems that the Invention is to Solve

However, in the manufacturing method disclosed in patent document 1, the orientation of copper in the copper layer laminated to the stainless steel substrate is not sufficient thus giving rise to a drawback that scratches or grooves may be formed on a surface of the copper layer.

Further, the manufacturing method disclosed in patent document 2 adopts the steps where crystals of copper in the copper layer are oriented and, thereafter, the copper layer is laminated to the stainless steel substrate by cold rolling. In this manner, the crystal-oriented copper layer is rolled and hence, there may be a case where the orientation of copper in the copper layer is lowered or scratches or grooves are formed on a surface of the copper layer due to such rolling. Accordingly, the orientation of the nickel layer, a superconducting layer or the like laminated to the copper layer is lowered thus giving rise to a drawback that properties of a superconducting body are lowered.

Further, in the manufacturing methods disclosed in the above-mentioned patent document 1 and patent document 2, the adhesive strength between the substrate and the copper layer laminated to the substrate is weak and hence, products which are manufactured using these metal substrates have a problem on reliability thereof.

Accordingly, it is an object of the present invention to provide a substrate for a superconducting compound and a method for manufacturing the substrate which can overcome these drawbacks, and can realize the excellent adhesive strength which the substrate is required to satisfy simultaneously with high orientation of copper.

Means for Solving the Problems (1) The present invention is directed to a substrate for a superconducting compound which includes:
a non-magnetic metal sheet;
a copper layer formed on the metal sheet; and
a protective layer formed on the copper layer, wherein
copper in the copper layer is diffused into the nonmagnetic metal sheet with a copper diffusion distance of 10 nm or more.

(2) The substrate for a superconducting compound according to the present invention is, in the above-mentioned (1), characterized in that the metal sheet is a nonmagnetic stainless steel sheet.

(3) The present invention is further directed to a method for manufacturing a substrate for a superconducting compound, the method including the steps of:
removing an absorbed material on a surface of a copper foil to which rolling is applied at a draft of 90% or more by applying sputter etching to the surface of the copper foil;
applying sputter etching to a surface of a nonmagnetic metal sheet;
forming a laminated body having a copper layer on the metal sheet by bonding the copper foil and the metal sheet to each other by applying pressure to the copper foil and the metal sheet using reduction rolls;
making crystals of copper in the copper layer oriented by heating the laminated body and diffusing the copper in the copper layer into the metal sheet by heating with a copper diffusion distance of 10 nm or more; and
laminating a protective layer to a surface of the copper layer of the laminated body.

(4) The method for manufacturing a substrate for a superconducting compound according to the present invention is, in the above-mentioned (3), characterized in that the metal sheet is a nonmagnetic stainless steel sheet.

Advantageous Effects of the Invention

According to the substrate for a superconducting compound called for in claim 1, the adhesiveness between the metal sheet and the copper layer laminated to the metal sheet is enhanced. According to the method for manufacturing a substrate for a superconducting compound called for in claim 3, the crystal of copper is oriented by applying heat treatment after the copper layer is laminated to the metal sheet and hence, compared to a prior art, copper can be highly oriented so that the generation of scratches and grooves on a surface of the copper layer can be prevented.

Further, by applying sputter etching to the copper layer while holding the copper layer at a temperature below a recrystallization starting temperature of copper, the copper layer can be laminated to the substrate while decreasing a change in copper in a rolling state compared to the prior art and hence, copper can be highly oriented compared to the prior art when copper which is rolled is oriented by heat treatment performed thereafter.

BEST MODE FOR CARRYING OUT THE INVENTION

A substrate for a superconducting compound according to an embodiment of the present invention includes: a nonmagnetic metal sheet; a copper layer formed on the metal sheet; and a protective layer formed on the copper layer, wherein copper in the copper layer is diffused into the nonmagnetic metal sheet with a copper diffusion distance of 10 nm or more.

A method for manufacturing such a substrate for a superconducting compound includes the steps of: removing an absorbed material on a surface of a copper foil to which rolling is applied at a draft of 90% or more by applying sputter etching to the surface of the copper foil; applying sputter etching to a surface of a nonmagnetic metal sheet; forming a laminated body having a copper layer on the metal sheet by bonding the copper foil and the metal sheet to each other by applying pressure to the copper foil and the metal sheet using reduction rolls; making crystals of copper in the copper layer oriented by heating the laminated body and diffusing the copper in the copper layer into the metal sheet by heating with a copper diffusion distance of 10 nm or more; and laminating a protective layer to a surface of the copper layer of the laminated body.

Embodiment 1

Figure 2:
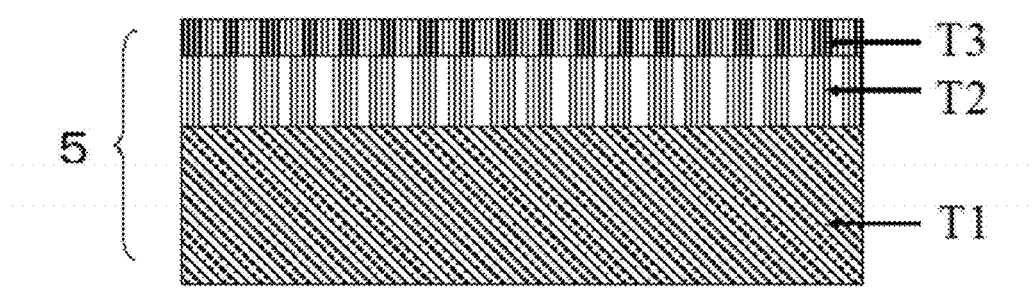
FIG. 2 is a schematic cross-sectional view showing the constitution of a substrate for a superconducting compound 5 according to an embodiment 1 of the present invention.

FIG. 2 is a schematic cross-sectional view showing the constitution of a substrate for a superconducting compound 5 according to the embodiment 1 of the present invention.

As shown in FIG. 2, the substrate for a superconducting compound 5 of the embodiment 1 is formed of a nonmagnetic metal sheet T1 which constitutes a substrate, a copper layer (copper foil) T2 which is laminated to the nonmagnetic metal sheet T1, and a protective layer T3 which is formed on the copper layer T2. Copper in the copper layer T2 is diffused into the nonmagnetic metal sheet T1 with a copper diffusion distance of 10 nm or more.

By diffusing copper into the nonmagnetic metal sheet T1 with the copper diffusion distance of 10 nm or more, the adhesive strength between the nonmagnetic metal sheet T1 and the copper layer T2 can be ensured.

<Nonmagnetic Metal Sheet>

The nonmagnetic metal sheet T1 plays a role of a reinforcing plate for a copper layer. Accordingly, as the nonmagnetic metal sheet T1, a metal sheet which is nonmagnetic (antiferromagnetic or paramagnetic) at a temperature of 77K where a substrate for a superconducting compound is used, and has strength higher than a copper foil which is used for forming the copper layer T2 can be used.

Further, it is preferable that the nonmagnetic metal sheet T1 is in a softened state, that is, the nonmagnetic metal sheet T1 is preferably made of a so-called annealed material (O material). The reason is that, the copper foil which is a bonding counterpart is hardened by applying cold-rolling to the copper foil at a high draft and hence, there may be a case where a further higher draft becomes necessary for ensuring a contact area when hardness of the metal sheet is excessively high so that warping after rolling is increased. Accordingly, to reduce warping after rolling by ensuring a contact area of a bonding boundary at a pressure as low as possible, it is preferable to hold the metal sheet T1 in a softened state.

As a specific example of the nonmagnetic metal sheet T1, for example, an annealed material of a stainless steel sheet such as a SUS316L sheet can be named, and when the nonmagnetic metal sheet T1 is formed of the stainless steel sheet, a thickness of the nonmagnetic metal sheet T1 is preferably set to 0.05 mm or more and 0.2 mm or less. The reason the thickness of the nonmagnetic metal sheet T1 is set to 0.05 mm or more is to allow the nonmagnetic metal sheet T1 to ensure sufficient strength, and the reason the thickness of the nonmagnetic metal sheet T1 is set to 0.2 mm or less is to allow the nonmagnetic metal sheet T1 to have workability at the time of working a superconducting material.

<Copper Foil>

As the copper foil which is used for forming the copper layer T2, it is preferable to use a full hard material which is made of copper or a copper alloy which is subjected to cold rolling at a draft of 90% or more. In this specification, the full hard material is a material which is obtained by a manufacturing method where cold rolling at a high draft is performed as a final step.

The reason the draft is set to 90% or more is that when a copper foil is subjected to cold rolling at a draft of less than 90%, there exists a possibility that copper will not be orientated in the heat treatment which is performed after rolling.

Further, from a viewpoint of strength and workability, a thickness of the copper foil T2 is preferably set to 7 μm or more and 50 μm or less.

The composition of the copper foil may preferably contain 100 ppm or more and 1% or less in total of addition elements such as Ag, Sn, Zn, Zr, O and N in copper. By adding 100 ppm or more of these elements to copper in total, the copper is strengthened by solid solution, and the crystal orientation of copper is improved compared to pure copper so that copper can acquire the higher biaxial orientation at the same draft.

On the other hand, when the total addition amount of these addition elements exceeds 1%, oxide or the like is formed in the copper foil so that a foreign substance is formed on a surface of the copper foil whereby the adhesiveness between the copper layer and the nonmagnetic metal sheet is lowered or the epitaxial growth of the protective layer is impeded. Accordingly, it is not preferable that the total addition amount of these addition elements exceeds 1%.

Among the above-mentioned addition elements, the addition of Ag is particularly effective in enhancing the crystal orientation, and the addition amount of Ag is preferably set to 100 ppm to 300 ppm.

<Protective Film>

An oxide intermediate layer made of $CeO_2$ or YSZ is formed on the substrate for a superconducting compound of this embodiment in an oxidizing atmosphere at a high temperature of 600° C. or above in a succeeding process. Accordingly, when the oxide intermediate layer is directly formed on a surface of the copper layer T2 by coating, there may be a case where it is difficult to uniformly ensure the adhesion due to oxidation of a surface of the copper layer T2. Accordingly, it is desirable that the protective layer is formed on the surface of the copper foil by coating after the heat treatment is performed. Provided that the protective layer epitaxially grows on the copper foil and the oxide intermediate layer epitaxially grows on the protective layer, the protective layer may have any composition. However, it is preferable that the protective layer is a nickel layer particularly.

As a method for forming the above-mentioned nickel layer by coating, any method can be used provided that the nickel layer is epitaxially grown such that the nickel layer succeeds the high biaxial crystal orientation of the copper foil. However, to take productivity into consideration, an electrolytic nickel plating method is preferably used.

Any bath such as a usual watt bath, a chloride bath, a sulfamic acid bath or the like may be used as an electrolytic nickel plating bath provided that matted plating or semi-bright plating is acquired.

Since nickel is a ferromagnetic material, a thickness of the nickel plating layer is preferably as thin as possible. However, it is necessary to prevent the metal diffusion of copper when the oxide intermediate layer is formed in a succeeding process. Accordingly, a thickness of the nickel plating layer is preferably set to 1 µm to 3 µm. The definition of the nickel layer in this embodiment also covers a nickel alloy layer.

<Manufacturing Method>

Figure 1:
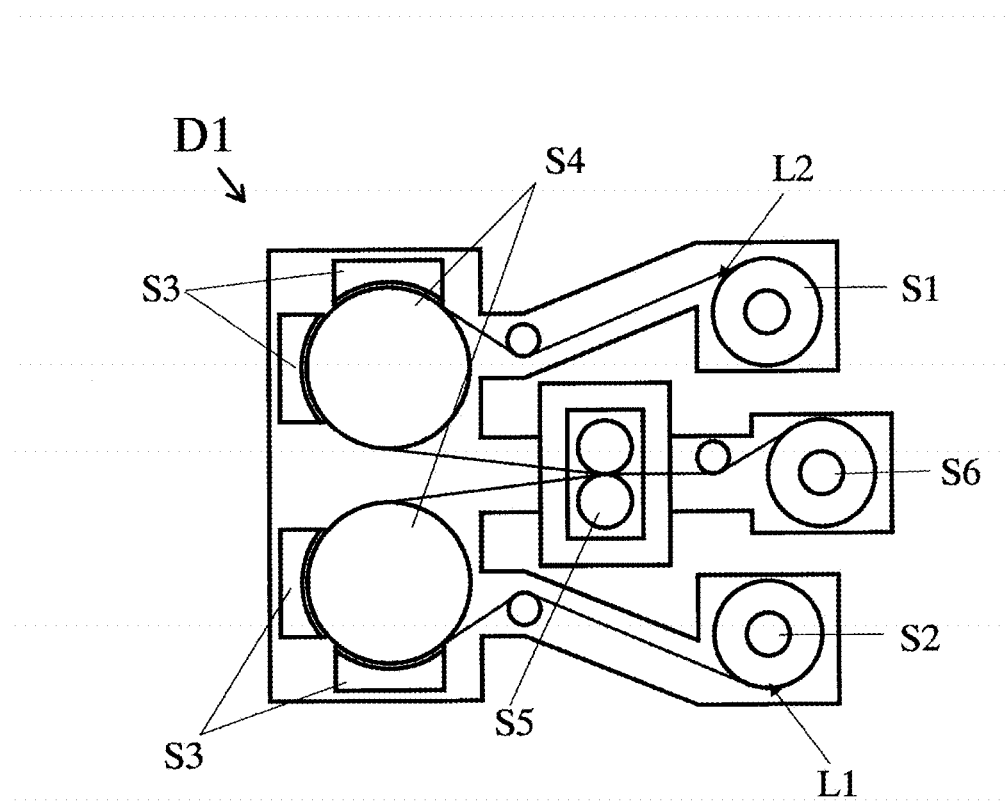
FIG. 1 is a schematic view of a surface activation bonding device used in the present invention.

As shown in FIG. 1, a nonmagnetic metal sheet L1 and a copper foil L2 are prepared as elongated coils having a width of 150 mm to 600 mm, and are mounted on recoiler portions S1, S2 of a surface activation bonding device D1 respectively. The nonmagnetic metal sheet L1 and the copper foil L2 which are conveyed from the recoiler portions S1, S2 are continuously conveyed to a surface activation treatment step where the activation treatment is applied to two bonding surfaces in advance and, thereafter, the nonmagnetic metal sheet L1 and the copper foil L2 are brought into pressure contact with each other by cold rolling.

The surface activation treatment is performed by applying sputter etching treatment wherein the nonmagnetic metal sheet L1 and the copper foil L2 having bonding surfaces are used as one-side electrodes A (S3) which are connected to a ground respectively, a glow discharge is generated by applying an AC current of 1 to 50 MHz between the one-side electrodes A and other-side electrodes B (S4) which are supported in an insulated manner, and an area of the electrode which is exposed in plasma generated by the glow discharge is not more than ⅓ of an area of the electrodes B. As an inert gas, argon, neon, xenon, krypton or a gas mixture containing at least one kind of gas selected from a group consisting of these gases is applicable.

In the sputter etching treatment, bonding surfaces of the nonmagnetic metal sheet L1 and the copper foil L2 are subjected to sputtering by an inert gas so that at least surface absorption layers are removed. Surface oxide films may be further removed. Due to such treatment, the bonding surfaces are activated. During this sputter etching treatment, the electrodes A (S3) take the form of cooling rolls thus preventing the elevation of temperatures of respective materials to be conveyed.

Thereafter, the nonmagnetic metal sheet L1 and the copper foil L2 are continuously conveyed to a pressure bonding roll step (S5) so that the activated surfaces are pressure-bonded to each other. When an $O_2$ gas or the like exists in the pressure bonding atmosphere, the activation processed surfaces are oxidized again during the conveyance thus influencing the adhesion. A laminated body which is formed by bonding the nonmagnetic metal sheet L1 and the copper foil L2 to each other in a close contact manner through the above-mentioned pressure bonding step is conveyed to a winding step (S6), and is wound in this step.

In the above-mentioned sputter etching step, although the absorbed material on the bonding surface is completely removed, it is unnecessary to completely remove a surface oxidized layer. This is because even when the oxidized layer remains on the whole surfaces of the nonmagnetic metal sheet L1 and the copper foil L2, by increasing a draft in the bonding step thus exposing bases of the nonmagnetic metal sheet L1 and the copper foil L2 by making use of friction on the bonding surface, it is possible to ensure bonding property between the metal sheet L1 and the copper foil L2.

Further, to completely remove the oxidized layer by dry etching, a high plasma output or etching for a long time becomes necessary so that a temperature of a material is elevated. Particularly, a recrystallization start temperature of the copper foil is approximately 150° C. and hence, when the temperature of the copper foil is elevated to 150° C. or above during sputter etching treatment, the recrystallization of the copper foil occurs so that crystals of the copper foil are oriented before bonding. When the crystal-oriented copper foil is rolled, strain is introduced into the copper foil so that the biaxial crystal orientation of the copper foil is deteriorated. Due to such a reason, in the sputter etching step, it is necessary to hold the temperature of the copper foil at a temperature below 150° C. The temperature of the copper foil is preferably held at 100° C. or below so as to hold the metallic structure of the copper foil in the rolling texture.

Also in the treatment where sputter etching is applied to the nonmagnetic metal sheet, when the temperature of the metal sheet is elevated to 150° C. or above by performing the treatment with a high plasma output or by performing the treatment for a considerable time, there exists a possibility that the temperature of the copper foil is elevated due to a contact between the metal sheet and the copper foil at the time of rolling whereby the recrystallization of the copper foil occurs simultaneously with the rolling thus deteriorating the biaxial crystal orientation.

Accordingly, also in the sputter etching step of the nonmagnetic metal sheet, it is desirable to hold the temperature of the metal sheet at a temperature below 150° C. The temperature of the metal sheet is preferably held at a temperature which falls within a range of a room temperature to 100° C.

Activation processing is applied to the surfaces of the nonmagnetic metal sheet and the copper foil in this manner and, thereafter, the nonmagnetic metal sheet and the copper foil are bonded to each other by the reduction rolls in vacuum. Although it is preferable that the degree of vacuum in this step is set high for preventing the re-absorption to the surface, it is sufficient that the degree of vacuum is set to $10^{-5}$ Pa or more and $10^{-2}$ Pa or less.

Further, the bonding strength between the nonmagnetic metal sheet and the copper foil is lowered due to the re-absorption of oxygen into the surface of the nonmagnetic metal sheet and the surface of the copper foil. Accordingly, it is also preferable to perform the bonding by the reduction rolls in a non-oxidizing atmosphere, for example, in an inert gas atmosphere such as an Ar gas atmosphere.

Applying of pressure by the reduction rolls is performed for ensuring an adhesion area of a bonding boundary between the nonmagnetic metal sheet and the copper foil as well as for exposing bases of the nonmagnetic metal sheet and the copper foil by peeling partial surface oxidized film layers by making use of friction which occurs in the bonding boundary at the time of rolling reduction. It is preferable to apply a pressure of 300 MPa or more.

By completely removing the absorbed material by sputter etching and by applying pressure bonding at a pressure of 300 MPa or more, it is possible to acquire adhesion strength by bonding of 0.1 N/cm or more in terms of 180° peel strength.

Particularly, the metal sheet is a strength reinforcing material, and the copper foil to be bonded is also a full hard material and hence, both materials are hard. Accordingly, it is preferable to apply a pressure of 600 MPa or more and 1.5 GPa or less to the metal sheet and the copper foil.

A pressure exceeding 1.5 GPa may be applied to the metal sheet and the copper foil, and it is confirmed that, at a draft of up to 30%, the crystal orientation is not deteriorated after the heat treatment performed later.

However, when the working with the pressure which exceeds 1.5 GPa, cracks occur on the surface of the copper foil, and also the crystal orientation of the copper foil after rolling and heat treatment is deteriorated.

Further, when a sputter etching time is short or when an applied pressure is low, the adhesive strength acquired by bonding is low because of a small adhesion area on a bonding boundary or small exposure of a base. However, when the adhesive strength is 0.1 N/cm on the whole surface of the sheet in terms of 180° peel strength, it is possible to allow the laminated body to pass through other steps such as a grinding step and a continuous heat treatment step without causing any problems.

As described above, provided that the adhesive strength is 0.1 N/cm or more in terms of 180° peel strength, a problem such as peeling does not occur in a laminated body passing step such as the grinding step or the heat treatment step by paying attentions to only handling. However, from a viewpoint of quality, it is desirable to ensure the adhesion strength of 3 N/cm or more in terms of 180° peel strength.

After the bonding step where the copper foil and the nonmagnetic metal sheet are bonded to each other by the reduction rolls, the laminated body is subjected to heat treatment at a temperature of 150° C. or above in a non-oxidizing atmosphere thus making crystals of the copper foil bi-axially oriented. When the heat treatment is applied at a temperature below 150° C., the biaxial crystal orientation of the copper foil cannot be ensured.

Further, to enhance the adhesive strength, it is necessary to treat the metal sheet at a temperature higher than a temperature at which an element of the nonmagnetic metal sheet is thermally diffused. For example, in the case where the nonmagnetic metal sheet is the SUS316L sheet, when the metal sheet is held at 400° C. or above, the metal diffusion, particularly, the movement of copper atoms into the metal sheet is generated in a bonding boundary so that the adhesive strength is enhanced.

With respect to a heat treatment condition in the present invention, the above-mentioned diffusion of copper atoms into the metal sheet is acquired by adjusting a temperature and a time. Although described later, it is known that the adhesion strength is enhanced to 3 N/cm or more in terms of 180° peel strength when a copper diffusion distance is set to 10 nm or more. Accordingly, the heat treatment may be performed under any heat condition provided that the heat treatment satisfies the above-mentioned condition. For example, in the case where a stainless steel sheet is used as the metal sheet, when the heat treatment temperature is 400° C., it is sufficient that the metal sheet is held in a batch type annealing furnace for 1 hour to 10 hours with respect to the heat treatment time.

On the other hand, when the metal sheet is treated at a high temperature of 700° C. or above, the metal sheet may be held in a continuous annealing furnace for several seconds to 5 minutes.

It is preferable that the metal sheet is treated at a temperature which falls within a range of 800° C. or above to 900° C. or below for 1 to 5 minutes so as to set a copper diffusion distance to 60 nm or more.

In this embodiment, in the case where an annealed material of a stainless steel sheet is used as the nonmagnetic metal sheet, strength of the nonmagnetic metal sheet is scarcely changed by heat treatment. Further, also in the case where a rolled material to which annealing is not applied is used as the nonmagnetic metal sheet, large lowering of strength is not observed under a condition that heat treatment is applied at 1000° C. and hence, the non-annealed rolled material also sufficiently plays a role of a strength reinforcing material.

Embodiment 2

Figure 3:
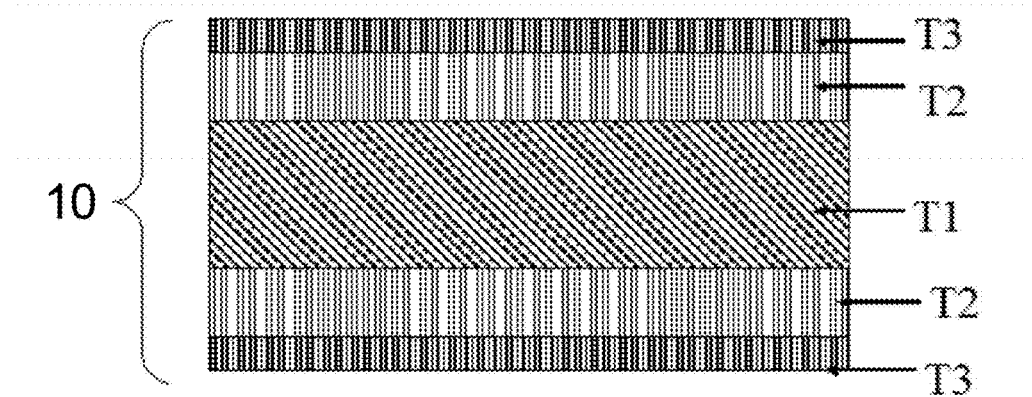
FIG. 3 is a schematic cross-sectional view showing the constitution of a substrate for a superconducting compound 10 according to an embodiment 2 of the present invention.

FIG. 3 is a schematic cross-sectional view showing the constitution of a substrate for a superconducting compound 10 according to the embodiment 2 of the present invention.

The substrate for a superconducting compound 10 of the embodiment 2 is formed such that a copper layer T2 is formed on both surfaces of a nonmagnetic metal sheet T1 which constitutes a substrate by surface activation bonding, and heat treatment is applied to a laminated body and, thereafter, a protective layer T3 formed of nickel plating is formed on the copper layer T2 formed on both surfaces of the laminated body.

Also in the substrate for a superconducting compound 10 of the embodiment 2, copper in the copper layer T2 is diffused into the nonmagnetic metal sheet T1 which is in contact with the copper layer T2 with a copper diffusion distance of 10 nm or more.

EXAMPLE 1

Hereinafter, the substrate for the superconducting compound of the present invention is explained in further detail in conjunction with examples.

EXPERIMENTAL EXAMPLE 1

A highly drafted copper foil having a width of 200 mm and a thickness of 18 µm and doped with 200 ppm of Ag and a SUS316L sheet (annealed material) having a thickness of 100 μm are bonded to each other using a surface activation bonding device shown in FIG. 1 thus forming a copper/SUS316L laminated body.

Sputter etching is performed under conditions where a pressure is 0.1 Pa or less, the plasma output is set to 200 W and an irradiation time for sputtering a bonding surface is set to 20 seconds thus completely removing an absorbed material layer on the copper foil and a metal sheet. A pressure applied to the laminated body by reduction rolls is set to 600 MPa.

Next, heat treatment is applied to the laminated body under a condition where a heating temperature is 500° C. and a heating time is 1 hour. With respect to the laminated body to which the heat treatment is applied, copper diffusion distance, peel strength, and the degree of crystal orientation of the (200) plane on a surface of a copper layer (Δφ of Cu) are measured respectively.

Further, nickel plating having a thickness of 1 μm is applied to the surface of the copper layer of the laminated body after the heat treatment as a protective layer and, thereafter, the degree of crystal orientation of the (200) plane of the nickel layer (Δφ of Ni) is measured. Nickel plating is performed using a usual watt bath with current density of 4 A/dm$^2$, at a bath temperature of 60° C. and with ph3.

<Measurement of Copper Diffusion Distance>

With respect to the copper/SUS316L laminated body before forming the protective layer (nickel coating), a distance where copper is diffused into the SUS316L sheet is measured by observation using a transmission electron microscope (TEM JEM-2010F made by JEOL Ltd.) and by an energy-dispersion X-ray spectrum analysis (EDS UTWSi—Li made by Noran Instruments, Inc.).

In defining the copper diffusion distance, an element analysis is applied to a SUS316L sheet side from a lamination boundary between the copper layer and the SUS316L sheet using the EDS, and a distance from the lamination boundary to a position where the copper concentration of 2 at % or more is detected is defined as the copper diffusion distance.

<Measurement of Degree of Crystal Orientation>

Further, with respect to the degree of crystal orientation, pole figures of copper (111) and nickel (111) are prepared using an X-ray diffraction apparatus (RINT 2500 made by Rigaku Corporation), and half value widths (°) of four peaks appearing at an angle α (=35°) are measured.

EXPERIMENTAL EXAMPLE 2-6

The conditions used in this example are set substantially equal to the conditions used in the experimental example 1-1 except for the heat treatment condition described in Table 1.

COMPARISON EXPERIMENTAL EXAMPLE 1

The conditions used in this example are set substantially equal to the conditions used in the experimental example 1-1 except for that, as described in Table 1, the heat treatment is not applied in this example.

Figure 4:
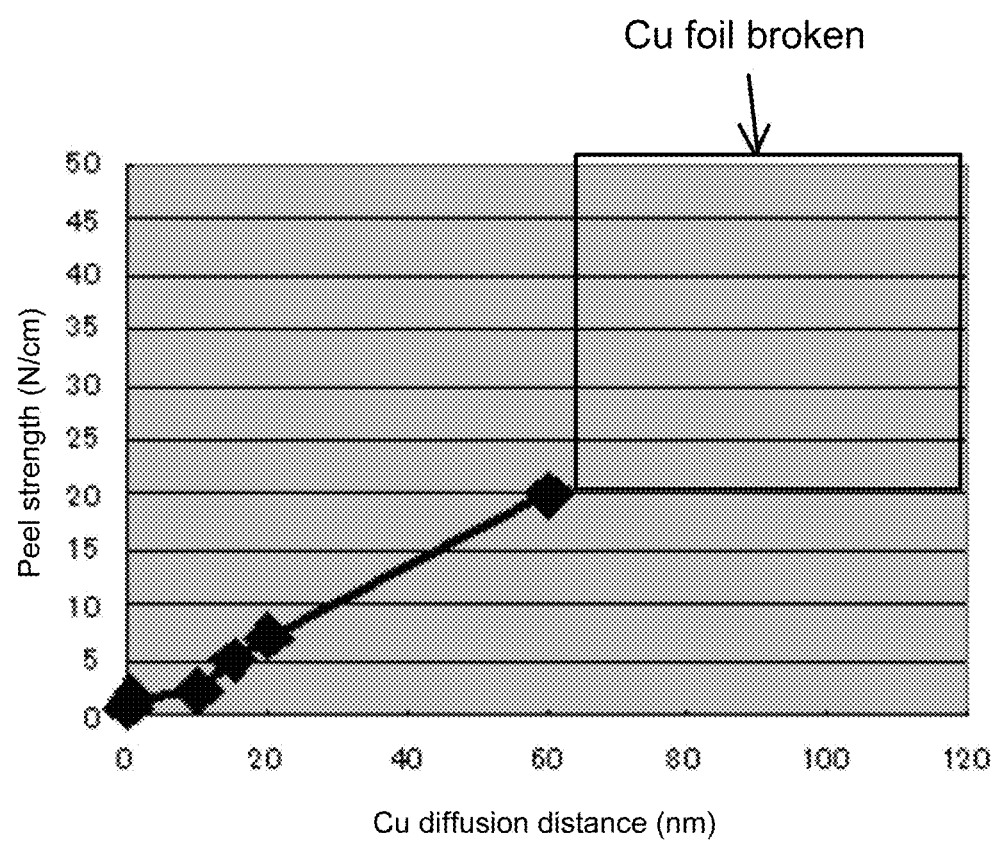
FIG. 4 is a graph showing the relationship between a distance by which copper is diffused into a SUS316L sheet from a boundary between a copper layer and the SUS316L sheet and 180° peel strength after heat treatment is applied to a copper/SUS316L laminated body before forming a protective layer by coating.
Figure 5:
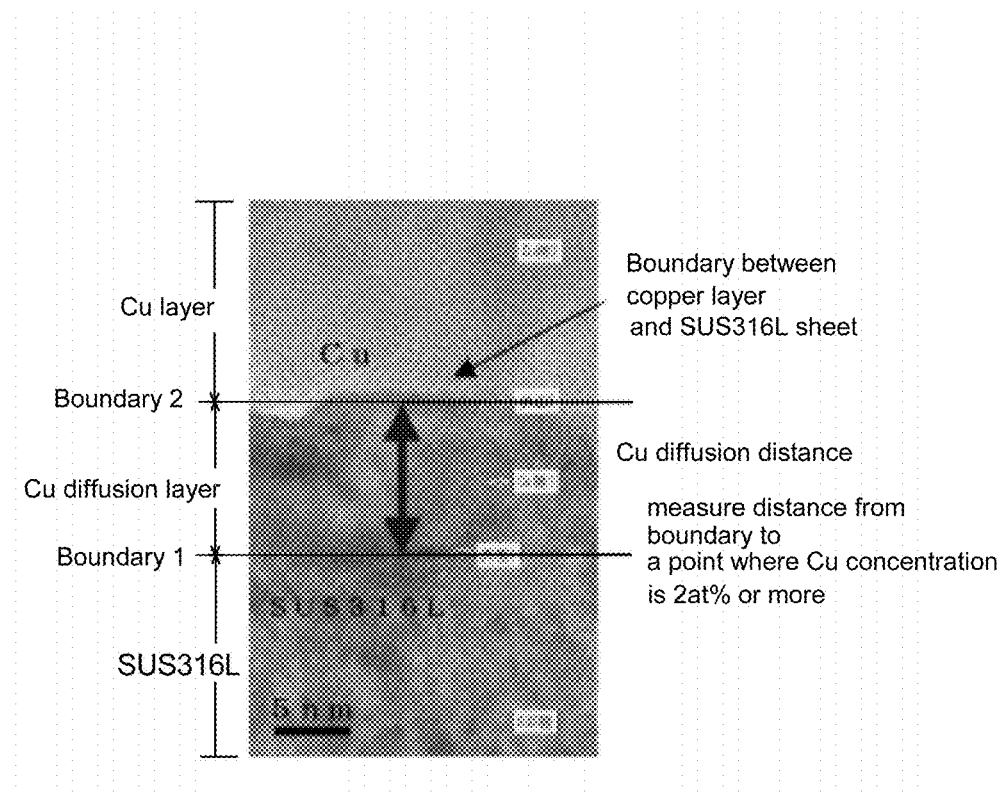
FIG. 5 is a photograph showing a TEM image of the boundary between the copper layer and the SUS316L sheet when the heat treatment is applied to the substrate for a superconducting compound according to the embodiment 1 of the present invention at a temperature of 600° C. for 1 hour.

Table 1 shows the heat treatment conditions used in the above-mentioned experimental examples and the respective measurement results. FIG. 4 shows the relationship between a distance at which copper is diffused into the SUS316L sheet from the boundary between the copper layer and the SUS316L sheet and 180° peel strength, and FIG. 5 shows a TEM image of the boundary between the copper layer and the SUS316L sheet when the heat treatment is applied to the copper/SUS316L laminated body according to the experimental example 2 at a temperature of 600° C. for 1 hour.

TABLE 1

| | heat treatment condition | Cu diffusion distance (nm) | peel strength (N/cm) | Δφ (°) of Cu | Δφ (°) of Ni | remarks on Δφ |
|---|---|---|---|---|---|---|
| comparison experimental example 1 | no heat treatment | 0 | 0.1 | — | — | |
| experimental example 1 | 500° C. 1 hour | 10 | 3 | 5.7 | 5.6 | all experimental examples showing favorable biaxial crystal orientation |
| experimental example 2 | 600° C. 1 hour | 15 | 5 | 5.7 | 5.6 | |
| experimental example 3 | 700° C. 1 hour | 20 | 7.5 | 5.5 | 5.4 | |
| experimental example 4 | 800° C. 5 minutes | 60 | 20 | 5.3 | 5.3 | |
| experimental example 5 | 850° C. 5 minutes | 100 | Cu foil broken | 5.3 | 5.3 | |
| experimental example 6 | 900° C. 5 minutes | 120 | Cu foil broken | 5.3 | 5.3 | |

In the comparison experimental example 1 where the heat treatment is not applied to the laminated body, the adhesive strength is 0.1 N/cm in terms of 180° peel strength, while in the experimental example 1 where the copper/SUS316L laminated body is held at a temperature of 500° C. for 1 hour so that the copper diffusion distance is set to 10 nm, the adhesive strength is 3.0 N/cm in terms of 180° peel strength.

As shown in the experimental examples 2 to 6, it is also understood that when the heat treatment temperature is elevated, the copper diffusion distance is increased and the peel strength is also increased, and at a stage where the diffusion distance of 100 nm is ensured, the peel strength is enhanced to a level that the copper foil is broken during the measurement.

Further, in the experimental examples 1 to 6 which are present invention examples, both the degree of biaxial crystal orientation Δφ of copper after heat treatment and the degree of biaxial crystal orientation Δφ of nickel after plating indicate values of 6° or less so that both degrees of biaxial crystal orientation are extremely excellent. With respect to the comparison experimental example 1, the heat treatment is not applied to the copper/SUS316L laminated body so that the crystal orientation is not generated in the copper layer whereby the measurement of the degree of the crystal orientation is not possible.

<Modification 1>

Figure 6:
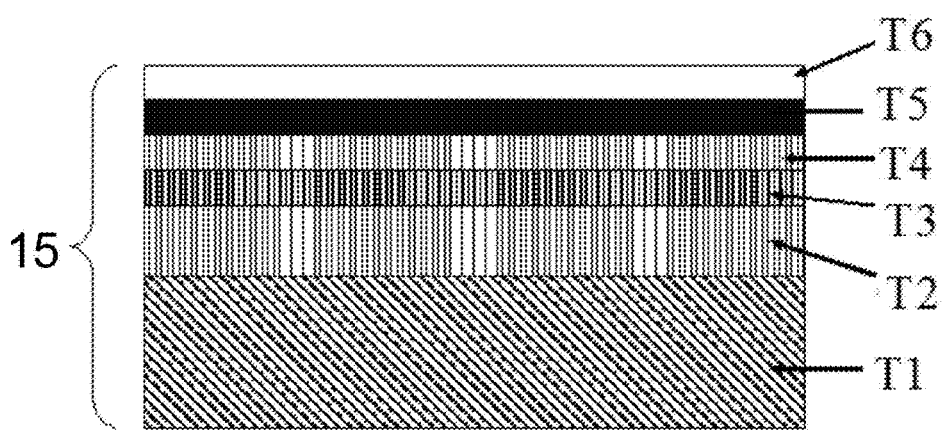
FIG. 6 is a schematic cross-sectional view showing a superconducting compound laminated sheet 15 according to a modification 1 where a superconducting compound is laminated to the substrate for a superconducting compound according to the present invention.

FIG. 6 is a schematic cross-sectional view showing a superconducting compound laminated sheet according to the modification 1 where a superconducting compound is laminated to the substrate for a superconducting compound according to the present invention.

The superconducting compound laminated sheet 15 of the modification 1 is manufactured such that, on a protective layer T3 of the substrate for a superconducting compound 10 of the embodiment 1 (see FIG. 2), an intermediate layer T4 made of CeO$_2$, zirconia doped yttrium oxide (YSZ) or the like, a superconducting compound layer T5 formed of an RE123 film or the like and a surface protective film T6 are further formed.

In the superconducting compound laminated sheet 15 of the modification 1, copper in a copper layer T2 is diffused into a nonmagnetic metal sheet T1 with a copper diffusion distance of 10 nm or more thus manufacturing the excellent superconducting compound laminated sheet 15 with high adhesive strength between the nonmagnetic metal sheet T1 and the copper layer T2.

<Modification 2>

Figure 7:
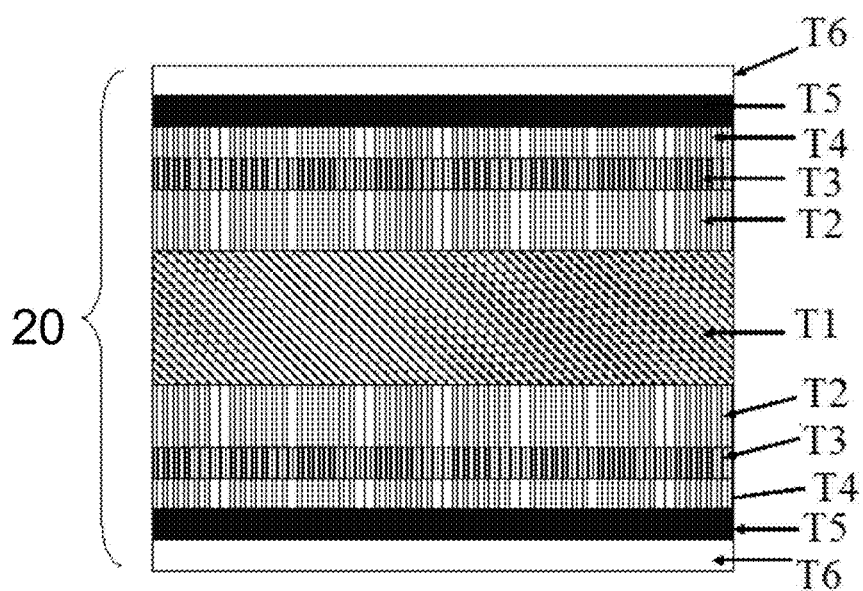
FIG. 7 is a schematic cross-sectional view showing a superconducting compound laminated sheet 20 according to a modification 2 where a superconducting compound is laminated to the substrate for a superconducting compound according to the present invention.

FIG. 7 is a schematic cross-sectional view showing a superconducting compound laminated sheet according to the modification 2 where a superconducting compound is laminated to the substrate for a superconducting compound according to the present invention.

The superconducting compound laminated sheet 20 of the modification 2 is manufactured such that, on a protective layer T3 formed on both surfaces of the substrate for a superconducting compound 10 of the embodiment 2 (see FIG. 3), an intermediate layer T4 made of $CeO_2$, zirconia doped yttrium oxide (YSZ) or the like, a superconducting compound layer T5 formed of an RE123 film or the like and a surface protective film T6 are further formed.

In the superconducting compound laminated sheet 20 of the modification 2, copper in the copper layers T2 formed on both surfaces of a nonmagnetic metal sheet T1 respectively is diffused into the nonmagnetic metal sheet T1 with a copper diffusion distance of 10 nm or more thus manufacturing the excellent superconducting compound laminated sheet 20 with high adhesive strength between the nonmagnetic metal sheet T1 and the copper layers T2.

INDUSTRIAL APPLICABILITY

According to the present invention, the orientation control of copper crystals and the diffusion treatment of copper are performed by applying heat treatment to the laminated body after the copper layer is laminated to the metal sheet. Accordingly, the adhesive strength which the substrate for a superconducting compound is required to satisfy can be realized simultaneously with the orientation of copper crystals whereby the present invention has extremely high industrial applicability.

DESCRIPTION OF REFERENCE NUMERALS AND SIGNS

T1, L1: nonmagnetic metal sheet
T2, L2: copper layer (copper foil)
T3: protective layer (nickel layer)
T4: oxide intermediate layer
T5: superconducting compound layer
T6: protective film
D1: surface activation bonding device
S1, S2: recoiler portion
S3: electrode A
S4: electrode B
S5: pressure bonding roll step
S6: winding step
5: substrate for a superconducting compound of embodiment 1
10: substrate for a superconducting compound of embodiment 2
15: superconducting compound laminated substrate of modification 1
20: superconducting compound laminated substrate of modification

The invention claimed is:

1. A method for manufacturing a substrate for a superconducting compound, the method comprising the steps of:
   removing an absorbed material on a surface of a cold-rolled copper foil by applying sputter etching to the surface of the cold-rolled copper foil, the cold-rolled copper foil having an absorbed material on the surface thereof and having been cold-rolled at a draft of 90% or more;
   applying sputter etching to a surface of a nonmagnetic metal sheet;
   applying together the surfaces which have been sputter etched of the cold-rolled copper foil and the nonmagnetic metal sheet, and
   forming a laminated body having a copper layer on the metal sheet by bonding the copper foil which has been cold-rolled at a draft of 90% or more and the metal sheet to each other by applying pressure to the copper foil and the metal sheet using reduction rolls;
   heating the laminated body and diffusing copper in the copper layer into the metal sheet while simultaneously providing a degree 4 of biaxial crystal orientation of the copper layer of 6° or less by heating with a copper diffusion distance of 10 nm or more so that the adhesion strength between the copper layer and the metal sheet is enhanced to 3 N/cm or more in terms of 180° peel strength; and
   laminating a protective layer having biaxial crystal orientation which indicates values of 6° or less in the degree of $\Delta\phi$ to a surface of the copper layer of the laminated body.

2. The method for manufacturing a substrate for a superconducting compound according to claim 1, wherein the metal sheet is a nonmagnetic stainless steel sheet.

3. The method of claim 1 wherein the nonmagnetic metal sheet is annealed.

4. The method of claim 1 wherein the nonmagnetic metal sheet has a thickness greater than 0.05 mm and no greater than 0.2 mm.

5. The method of claim 1 wherein the copper foil has a thickness of 7 μm-50 μm.

6. The method of claim 1 wherein the copper foil comprises 100 ppm up to 1% in total of one or more additional elements selected from the group consisting of Ag, Sn, Zn, Zr, O and N.

7. The method of claim 1 wherein the copper foil comprises 100-300 ppm of Ag.

* * * * *